(12) United States Patent
Rajendran et al.

(10) Patent No.: US 8,264,281 B1
(45) Date of Patent: Sep. 11, 2012

(54) LOW-NOISE AMPLIFIER WITH TUNED INPUT AND OUTPUT IMPEDANCES

(75) Inventors: Gireesh Rajendran, Bangalore (IN); Visvesvaraya Appala Pentakota, Bangalore (IN); Vijaya Bhaskar Rentala, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/152,294

(22) Filed: Jun. 3, 2011

(51) Int. Cl.
*H03F 3/04* (2006.01)
(52) U.S. Cl. .................................. 330/301; 330/311
(58) Field of Classification Search .............. 330/171, 330/301, 311
See application file for complete search history.

(56) References Cited

U.S. PATENT DOCUMENTS

| | | | |
|---|---|---|---|
| 6,559,723 B2 * | 5/2003 | Hollenbeck et al. | 330/301 |
| 7,646,250 B2 * | 1/2010 | Mun et al. | 330/301 |
| 7,760,028 B2 * | 7/2010 | Sanduleanu et al. | 330/301 |
| 7,834,703 B2 * | 11/2010 | Ganeshan | 330/301 |

OTHER PUBLICATIONS

Federico Bruccoleri, Eric A. M. Klumperink, and Bram Nauta, "Wide-Band CMOS Low-Noise Amplifier Exploiting Thermal Noise Canceling", IEEE Journal of Solid-State Circuits, vol. 39, No. 2, Year Feb. 2004, pp. 275-282.

* cited by examiner

*Primary Examiner* — Khanh V Nguyen
(74) *Attorney, Agent, or Firm* — Ronald O. Neerings; Wade James Brady, III; Frederick J. Telecky, Jr.

(57) ABSTRACT

A low-noise amplifier (LNA) includes a pair of transistors connected in a cascode configuration to provide amplification to an input signal. The LNA generates an amplified output in differential form across a pair of output terminals. One of the pair of output terminals is the output node of the cascode configuration. The LNA further includes a feedback transistor with its gate terminal connected to the output node of the cascode configuration and its drain terminal connected to the other one of the pair of output terminals. The differential nature of the amplified output reduces the noise figure of the LNA. A frequency-selective network connected across the pair of output terminals sets the frequency selectivity of each of the input section and the output section of the LNA.

18 Claims, 2 Drawing Sheets

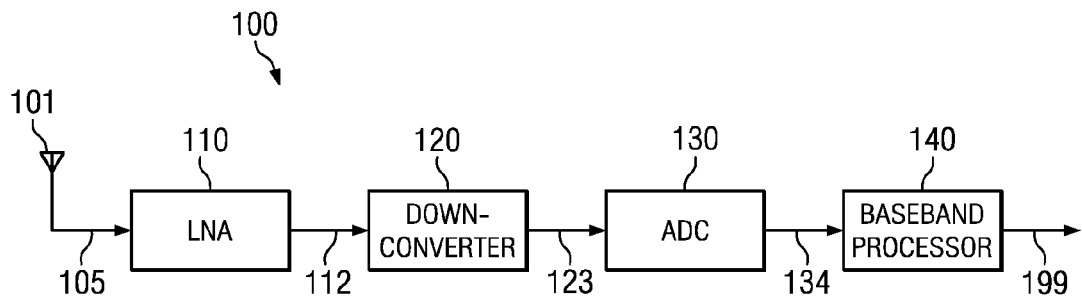
FIG. 1
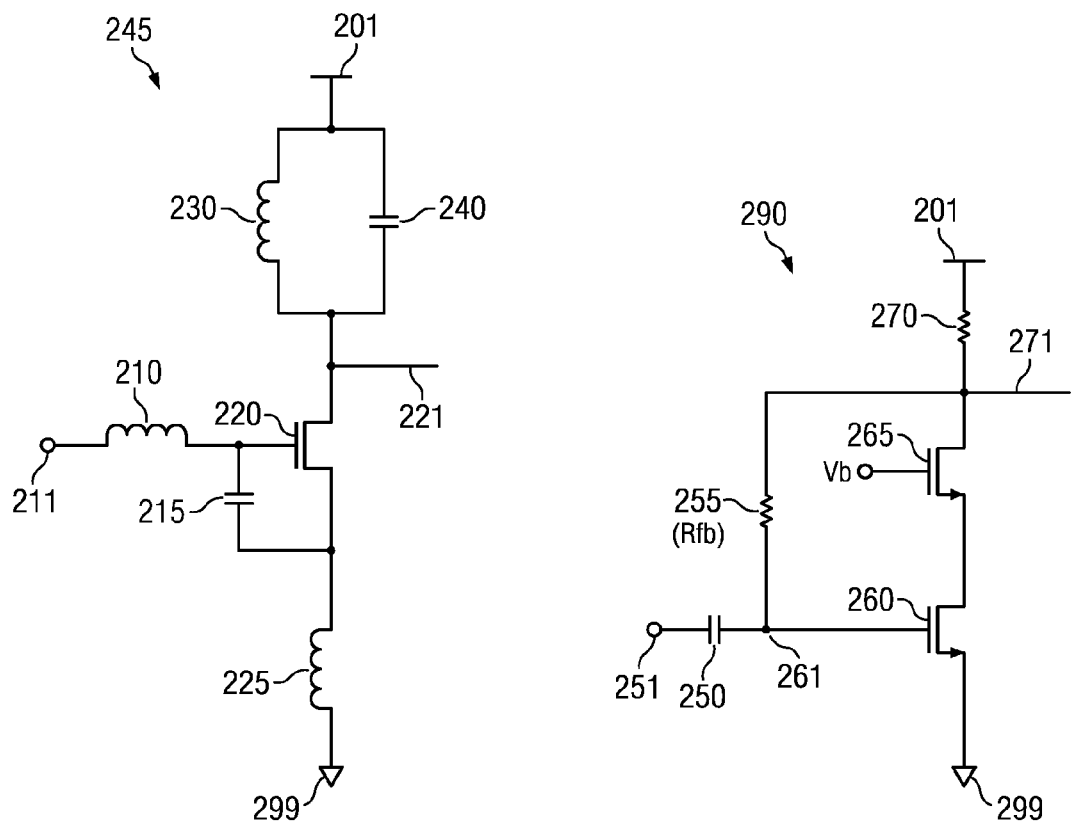
FIG. 2A
(PRIOR ART)
FIG. 2B
(PRIOR ART)

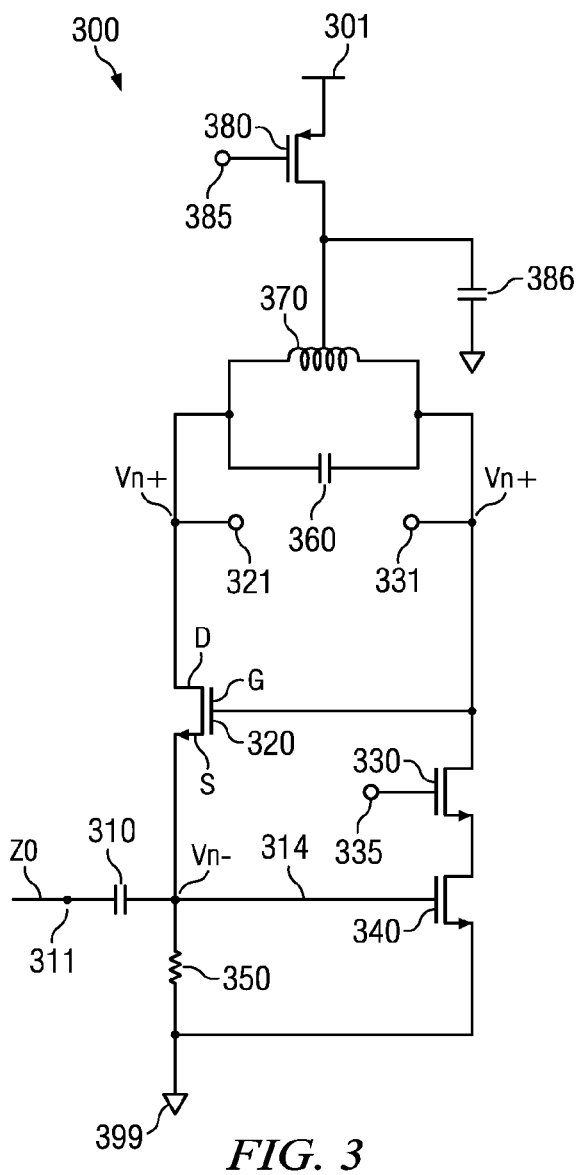
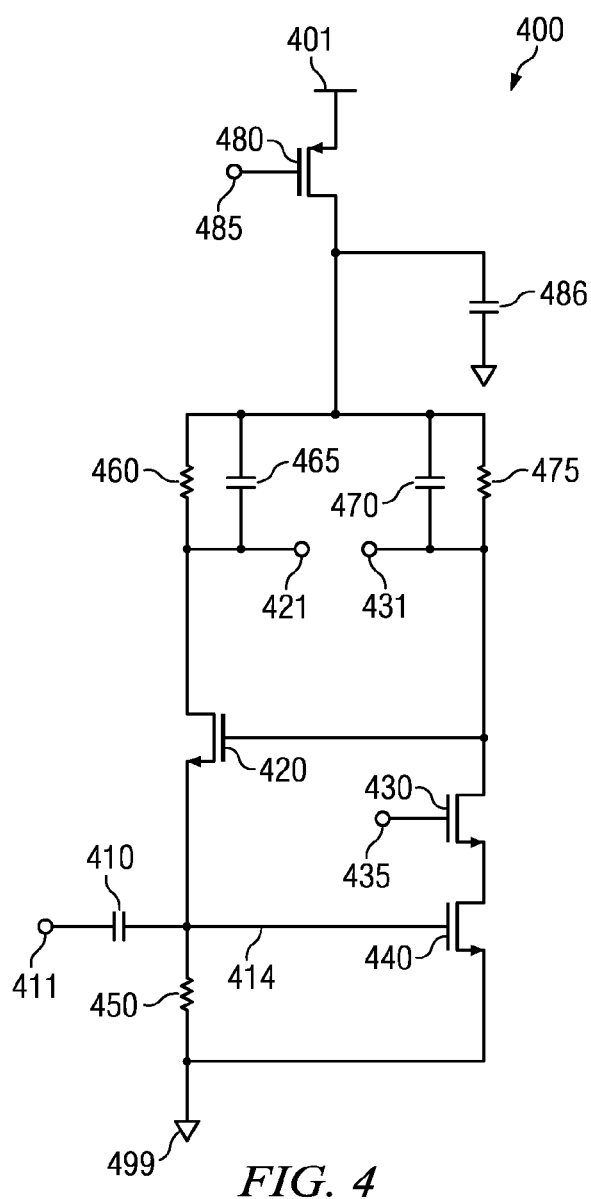
FIG. 3
FIG. 4

LOW-NOISE AMPLIFIER WITH TUNED INPUT AND OUTPUT IMPEDANCES

BACKGROUND

1. Technical Field

Embodiments of the present disclosure relate generally to amplifiers, and more specifically to a low-noise amplifier with tuned input and output impedances.

2. Related Art

Low-noise amplifiers (LNA) are commonly used to amplify an input signal and provide a corresponding amplified output signal with minimal addition of noise. LNAs are often employed in environments in which matched impedances are required both at the input and output of the LNA. For example, LNAs are typically used at the front-end of communication receivers, and may need to handle input and output signals of high frequencies. Wired paths (for example, from an antenna) connected to an input terminal of an LNA typically behave as transmission lines and are associated with a characteristic impedance at the frequency-band(s) of interest. Similarly, wired paths connecting the output terminal of an LNA to another component in the signal chain may also behave as a transmission in the frequency band(s) of interest. Thus, both the input impedance of the LNA as well as the output impedance of the LNA may need to be matched to (i.e., tuned to be equal to) the characteristic impedance of the transmission line(s). Further, an LNA may be required to provide the (same) matched input and output impedances over a range of frequencies, typically representing a frequency-band of interest.

Input impedance of a circuit (such as an LNA), as is well-known in the relevant arts, is the ratio of a voltage applied at the input terminal of the circuit and the resulting current drawn from the source providing the voltage. The output impedance is generally the impedance in series with a voltage source representing the output portion of the circuit. Output impedance may be represented as the Thevenin equivalent impedance looking into the output terminals of a circuit.

Some prior LNAs use resistors as part of the impedance matching network that provides the matched impedance (input impedance or output impedance). As is well known in the relevant arts, resistors add to noise due to thermal effects, and such an approach may not be desirable. Some other LNAs use a relatively large number of components to provide the tuned input and output impedances, and may not be desirable at least for this reason.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning of the claims.

An amplifier has an input terminal to receive an input signal, and is designed to provide an amplified signal in differential form as an output across a pair of output terminals. The amplifier includes a first transistor, a second transistor and a frequency-selective network. The first transistor is connected between a first one of the pair of output terminals and a constant reference potential. A control terminal of the first transistor is connected to the input terminal. The first transistor is used to amplify the input signal. The second transistor is connected between a second one of the pair of output terminals and the input terminal. A control terminal of the second transistor is connected to the first one of the pair of output terminals. The frequency-selective network is connected between the first one of the pair of output terminals and the second one of the pair of output terminals.

Several embodiments of the present disclosure are described below with reference to examples for illustration. It should be understood that numerous specific details, relationships, and methods are set forth to provide a full understanding of the embodiments. One skilled in the relevant art, however, will readily recognize that the techniques can be practiced without one or more of the specific details, or with other methods, etc.

BRIEF DESCRIPTION OF THE VIEWS OF DRAWINGS

Example embodiments will be described with reference to the accompanying drawings briefly described below.

FIG. 1 is a block diagram illustrating the details of an example device in which several embodiments can be implemented.

FIG. 2A is a circuit diagram of a prior LNA.

FIG. 2B is a circuit diagram of another prior LNA.

FIG. 3 is a circuit diagram illustrating the implementation details of a LNA in an embodiment.

FIG. 4 is a circuit diagram illustrating the implementation details of a LNA in an alternative embodiment.

The drawing in which an element first appears is indicated by the leftmost digit(s) in the corresponding reference number.

DETAILED DESCRIPTION

Various embodiments are described below with several examples for illustration.

1. Example Device

FIG. 1 is a block diagram of an example device in which several embodiments can be implemented. Device 100, which may correspond to a wireless receiver, is shown containing antenna 101, low-noise amplifier (LNA) 110, down-converter 120, analog to digital converter (ADC) 130, and baseband processor 140. The specific blocks of FIG. 1 are shown merely by way of illustration, and device 100 may be implemented to contain more or fewer blocks and/or components.

Antenna 101 receives a signal on a wireless medium, and provides the signal to LNA 110 on path 105. LNA 110 amplifies the signal on path 105 to generate an amplified signal on path 112. LNA 110 is designed to have a low noise figure (NF). Down-converter 130 performs mixing operations on amplified signal 112 to lower the carrier frequency of signal 112, and filters unwanted sidebands of the mixing operation. Down-converter 130 provides the down-converted (and filtered) signal on path 123.

ADC 130 converts the down-converted analog signal on path 123 to corresponding digital values, provided on path 134. Baseband processor 140 processes the digital values received on path 134 to demodulate the modulated signal represented by the digital values, and thus to extract data/information (or baseband signal in general) contained in the modulated signal.

The signal on path 105 may occupy a band of frequencies, termed the frequency-band of interest. As noted above, at high frequencies, such as the frequencies in the frequency-band of interest, wired paths 105 and 112 may behave as transmission lines, and thus be associated with a characteristic impedance. To minimize or prevent signal loss (for example, due to possible signal reflections, etc., due to impedance mismatch) at the junction between wired path 105 and the input of LNA 110, as well as at the junction between the output of LNA 110 and wired path 112, the input impedance of LNA 110 is designed to equal (i.e., tuned to) the characteristic impedance of wired path 105, and the output impedance of LNA 110 is designed to equal (i.e., tuned to) the characteristic impedance of wired path 112. The input and output impedance matching generally needs to be achieved with minimal or no noise addition to signal 105.

FIG. 2A is a circuit diagram of a prior LNA. Prior LNA 245 is shown implemented as a common-source amplifier, and is shown containing metal oxide semiconductor (MOS) transistor 220, inductors 210, 225 and 230, and capacitors 215 and 240. Terminal 211 receives an input signal to be amplified, and an amplified signal is generated on path 221. In FIGS. 2A and 2B, terminals 201 and 299 respectively represent power supply and ground terminals. The input impedance (Z) of LNA 245 is specified by Equation 1 below:

$$Z=(gm*L225/C215)+[j\omega L210+1/j\omega C215] \quad \text{Equation 1}$$

wherein, gm represents the transconductance of transistor 220,

L225 represents the inductance of inductor 225,

L210 represents the inductance of inductor 210, jωL210 represents the impedance offered by inductor 210, and jωL215 represents the impedance offered by inductor 215.

The term (gm*L225/C215) sets the desired value of input impedance (e.g., 50 ohms) by appropriate selection of values for gm, L225 and C215. The term [jωL210+1/jωC215] is designed to equal zero for the frequency-band of interest, thereby providing frequency selectivity to the input section of LNA 245. Inductor 230 and capacitor 240 form a tuned circuit, and the values of inductance of inductor 230 and capacitance of capacitor 240 are selected to provide a desired output impedance of prior LNA 245 in the frequency-band of interest. Thus, the combination of inductor 230 and capacitor 240 provides frequency selectivity to the output section of LNA 245. As may be observed from FIG. 2A, LNA 245 requires a relatively large number of components (inductors, capacitors etc), and therefore such an implementation may not be desirable.

FIG. 2B is a circuit diagram of another prior LNA. Prior LNA 290 is shown containing MOS transistors 260 and 265, capacitor 250, and resistors 255 and 270. The gate terminal of transistor 265 receives a fixed bias voltage Vb. Terminal 251 receives an input signal to be amplified. Prior LNA 290 generates an amplified signal on path 271. Capacitor 250 is used to ac-couple input 251 to LNA 290. LNA 290 is implemented as a cascode amplifier.

The input impedance (Zin) of LNA 290 equals (Rfb/A), wherein Rfb is the resistance of resistor 255, and 'A' represents the voltage gain from node 261 to node 271. Resistance Rfb generates thermal noise. As a result, the noise figure of LNA 290 is degraded, and such an implementation may also not be desirable.

2. Low-Noise Amplifier

FIG. 3 is a circuit diagram illustrating the implementation details of a LNA in an embodiment. LNA 300 of FIG. 3, which can be used in place of LNA 110 of FIG. 1, has a band-pass frequency response, and is shown containing N-type MOS transistors (NMOS) 320, 330 and 340, P-type MOS transistor (PMOS) 380, capacitors 310, 360 and 386, resistor 350 and inductor 370. A single-ended input signal to be amplified is received on input terminal 311. Capacitor 310 is used to ac-couple input 311 to LNA 300. Capacitor 386 provides a low impedance path to ground for signal 331 (or 321). An amplified output is provided in differential form across output terminals 321 and 331. The source, gate and drain terminals of NMOS 320 are respectively labeled S, G and D in FIG. 3. The terminals of the other transistors are not marked in FIG. 3, but can be identified from the symbol/notation used. Terminals 301 and 399 respectively represent power supply and ground terminals. Path 311 of FIG. 3 corresponds to path 105 of FIG. 1. Differential output terminals 321/331 (pair of output terminals) may be connected to a differential path that would correspond to path 112 of FIG. 1.

Input signal 311 is ac-coupled by capacitor 310 to the gate terminal (314) of transistor 340 (first transistor). Transistors 340 and 330 (third transistor) form a cascode arrangement, and operate to provide an amplified version of signal 314 (or equivalently 311) at node 331. Node 331 is the output node of the cascode arrangement or configuration. The gate, source and drain terminals of transistor 320 (second transistor) are respectively connected to node 331, node 314 and node 321. Transistor 320 may be viewed as a 'feedback transistor'. The parallel connection of inductor 370 and capacitor 360 forms a tuned circuit (frequency-selective network), which is connected across the pair of output terminals 321 and 331. Terminals 321 and 331 are also the terminals of the frequency-selective network. The source terminal of PMOS 380 is connected to power supply 301, and the drain terminal is connected to the centre tap of inductor 370. PMOS 380 receives a bias voltage on its gate terminal 385, and operates as a current source to bias transistors 320, 330 and 340. Resistor 350 is used to set the operating point of transistor 340.

The input impedance (Zin) of LNA 300 is specified by Equation 2 below:

$$Zin=[1/(gm320*G)] \quad \text{Equation 2}$$

wherein, gm320 represents the transconductance of transistor 320, and

G represents the voltage gain from node 314 to node 331, and is thus also the gain of LNA 300.

G equals gm340*Z1, wherein gm340 represents the transconductance of transistor 340, and Z1 equals [½*(Q²+1)*Rs], wherein Q is the quality factor of inductor 370 and Rs is the equivalent loss resistance in series with inductor 340. The values of G and gm320 are designed to have values to provide an input impedance equal to the characteristic impedance (Z0, shown marked in FIG. 3) of the input path connected to node 311.

Assuming that the current-noise in the current flowing through transistor 320 has positive (Vn+) and negative polarities (Vn−) at nodes 321 and 314 respectively, the current-noise generates an equal noise with positive polarity (Vn+) at node 331. Thus, the differential output voltage (which is the amplified version of input 311) across nodes 321 and 331 is rendered free of the current-noise. As a result, the noise figure of LNA 300 is reduced by that extent. Transconductance gm320 is typically designed to have a low value, and the current through transistor 320 therefore has a relatively low value. Consequently, the current-noise content from the biasing source, i.e., transistor 380, is also low.

LNA 300 has a band-pass frequency response set by inductor 370 and capacitor 360. The parallel LC circuit formed by inductor 370 and capacitor 360 can be tuned (by selection of appropriate values of inductance of inductor 370 and capacitance of capacitor 360) such that the impedance offered by the LC circuit is maximized for the frequency-band of interest, i.e., the range of frequencies of interest in input 311.

The gain G of LNA 300, being dependent on the impedance offered by the LC circuit formed by inductor 370 and capacitor 360, the input impedance (Zin) is set to the desired value (equal to the characteristic impedance of the input path, as noted above) only for the frequency-band of interest, and has other values outside the frequency-band of interest. As a result, additional frequency selectivity (in addition to that provided by the LC circuit formed by inductor 370 and capacitor 360) is achieved for LNA 300 due to mismatched input impedance values outside the frequency-band of interest resulting in signal-transfer losses from input path 311 into LNA 300.

The impedance offered by the tuned LC circuit formed by inductor 370 and capacitor 360 equals the output impedance of LNA 300. Thus, both the input impedance and the output impedance of LNA 300 are tuned (set to have the desired value in the frequency-band of interest) by the LC circuit, and the frequency-selective network formed by inductor 370 and capacitor 360 determines the frequency selectivity of both the input section and the output section of amplifier 300. The input section may be viewed as being the equivalent circuit between nodes 314 and ground 399, while the output section may be viewed as the equivalent circuit generating the output signal across nodes 321 and 331. Since, a single frequency-selective circuit determines the frequency selectivity of both the input and output sections, separate tuning circuits or tuning networks are not required for tuning the input and output impedances.

Thus, LNA 300 has a low noise figure (NF) due to cancellation of current-noise contributed by transistor 320, and offers matched input and output impedances with a relatively small number of components. It is noted here that, in other embodiments of LNA 300, transistor 330 may not be implemented, and the drain terminal of transistor 340 may instead be connected directly to node 331.

FIG. 4 is a circuit diagram illustrating the implementation details of a LNA in another embodiment. LNA 400 of FIG. 4, which can be used in place of LNA 110 of FIG. 1, has a low-pass frequency response, and is shown containing NMOS 420, 430 and 440, PMOS 480, capacitors 410, 465, 470 and 486, and resistors 450, 460 and 475. An input signal to be amplified is received on input terminal 411, and a corresponding amplified output is provided in differential form across output terminals 421 and 431 (pair of output terminals). Node 431 is the output node of the cascode arrangement formed by transistors 440 and 430 (third transistor). Terminals 401 and 499 represent power supply and ground terminals respectively. Terminals 485 and 435 receive bias voltages.

NMOS 420, 430 and 440, PMOS 480, capacitor 410, and resistor 450, and the corresponding connections and operations are identical to those of NMOS 320, 330 and 340, PMOS 380, capacitor 310, and resistor 350 of FIG. 3, and the description is not repeated here in the interest of conciseness. Capacitor 486 provides a low impedance path to ground for signal 431 (or 421). Transistor 420 may be viewed as a 'feedback transistor'.

The parallel RC circuit formed by resistor 475 and capacitor 470 determines the frequency response of LNA, and provides a low-pass frequency response. The parallel RC circuit formed by resistor 460 and capacitor 465 is identical to that formed by resistor 475 and capacitor 470, and is provided due to the differential nature of the amplified output generated across output terminals 421 and 431. The series connection of (resistor 475 and capacitor 470) and (resistor 460 and capacitor 465) forms a frequency-selective network connected across output terminals 421 and 431. The bandwidth of the low-pass frequency response of LNA 400 may be set by selecting appropriate values for the resistances of resistors 475 and 460 and the capacitance of capacitors 465 and 470. Terminals 421 and 431 are also the terminals of the frequency-selective network formed by the series connection of the two RC circuits noted above.

Input impedance of LNA 400 equals $[1/[(gm420*gm440*R475)]]$, wherein gm420 is the transconductance of transistor 420, gm440 is the transconductance of transistor 440, and R475 is the resistance of resistor 475. Representing the impedance of the parallel combination of R475 and C470 as Zrc, the product (gm440*Zrc) represents the gain provided by the cascode configuration formed by transistors 440 and 430. Similar to that in LNA 300 of FIG. 3, the amplified output of LNA 400 is tapped differentially across nodes 421 and 431 to cancel current-noise due to transistor 420. Transconductance gm420 is designed to have a low value, and the current through transistor 420 therefore has a relatively low value. Consequently, the current-noise content from the biasing source, i.e., transistor 480, also is low.

The gain of LNA 400, being dependent on the impedance offered by the RC circuit formed by resistor 475 and capacitor 470, the input impedance of LNA 400 is set to the desired value (equal to the characteristic impedance of the input path 411) only for the frequency-band of interest, and has other values outside the frequency-band of interest. As a result, additional frequency selectivity (in addition to that provided by the RC circuit formed by resistor 475 and capacitor 470) is achieved for LNA 400 due to mismatched values of input impedances outside the frequency-band of interest resulting in signal-transfer losses from input path 411 into LNA 400.

The sum of the impedance of the RC circuit formed by the parallel combination of resistor 475 and capacitor 470 and the impedance of the RC circuit formed by the parallel combination of resistor 460 and capacitor 465 equals the differential output impedance of LNA 400. Thus, both the input impedance and the output impedance of LNA 400 are tuned (set to the desired value in the frequency-band of interest) by the two (identical) RC circuits noted above. Thus, a single frequency-selective network determines the frequency selectivity of both the input section and the output section of amplifier 300. The input section may be viewed as being the equivalent circuit between nodes 414 and ground 499, while the output section may be viewed as the equivalent circuit generating the output signal across nodes 421 and 431. Since, a single frequency-selective circuit determines the frequency selectivity of both the input and output sections, separate tuning circuits or tuning networks are not required for tuning the input and output impedances.

LNA 400 has a low noise figure (NF) (i.e., adds very little noise to input 411) due to cancellation at output 431/421 of the current-noise contributed by transistor 420, and offers matched input and output impedances with a relatively small number of components. In other embodiments of LNA 400, transistor 430 may not be implemented, and the drain terminal of transistor 440 is instead connected directly to node 431.

While in the illustrations of FIGS. 1, 3 and 4, although terminals/nodes are shown with direct connections to various other terminals, it should be appreciated that additional components (as suited for the specific environment) may also be present in the path, and accordingly the connections may be viewed as being electrically coupled to the same connected terminals. In the instant application, power supply and ground terminals are referred to as constant reference potentials.

It should be appreciated that the specific type of transistors (such as NMOS, PMOS, etc.) noted above with respect to FIGS. 3 and 4 are merely by way of illustration. However, alternative embodiments using different configurations and other types of transistors, such as bipolar junction transistors (BJT) or a combination of MOS and BJT, will be apparent to one skilled in the relevant arts by reading the disclosure provided herein. For example, NMOS transistors and PMOS transistors may be swapped, while also interchanging the connections to power and ground terminals. Accordingly, in the instant application, the source (emitter) and drain (collector) terminals (through which a current path is provided when turned ON and an open path is provided when turned OFF) of transistors are termed as current terminals, and the gate (base) terminal is termed as a control terminal.

While various embodiments of the present disclosure have been described above, it should be understood that they have been presented by way of example only, and not limitation. Thus, the breadth and scope of the present disclosure should not be limited by any of the above-described embodiments, but should be defined only in accordance with the following claims and their equivalents.

What is claimed is:

1. An amplifier comprising:
   an input terminal to receive an input signal;
   a pair of output terminals to provide an amplified input signal in differential form;
   a first transistor coupled between a first one of the pair of output terminals and a constant reference potential, wherein a control terminal of the first transistor is coupled to the input terminal, the first transistor to amplify the input signal;
   a second transistor coupled between a second one of the pair of output terminals and the input terminal, wherein a control terminal of the second transistor is coupled to the first one of the pair of output terminals; and
   a frequency-selective network coupled between the first one of the pair of output terminals and the second one of the pair of output terminals.

2. The amplifier of claim 1, wherein the frequency-selective network determines a frequency selectivity of each of the input section and output section of the amplifier.

3. The amplifier of claim 1, wherein the input terminal is designed to receive the input signal in single-ended form.

4. The amplifier of claim 2, further comprising a third transistor coupled between the first one of the pair of output terminals and the first transistor, wherein the first transistor and the third transistor together form a cascode configuration.

5. The amplifier of claim 2, wherein the frequency-selective network sets the frequency selectivity as a band-pass frequency response.

6. The amplifier of claim 2, wherein the frequency-selective network sets the frequency selectivity as a low-pass frequency response.

7. An amplifier comprising:
   a first capacitor, a first terminal of the first capacitor coupled to receive a single-ended input signal;
   a first transistor, a control terminal of the first transistor being coupled to a second terminal of the first capacitor, and a first current terminal of the first transistor being coupled to a first constant reference potential;
   a first resistor coupled between the control terminal of the first transistor and the first constant reference potential;
   a second transistor, a control terminal of the second transistor being coupled to a second current terminal of the first transistor, and a first current terminal of the second transistor being coupled to the control terminal of the first transistor; and
   a frequency-selective network coupled between the second current terminal of the first transistor and a second current terminal of the second transistor,
   wherein the amplifier generates, in differential form, an amplified output signal representing the single-ended input signal across a first terminal of the frequency selective network and a second terminal of the frequency selective network.

8. The amplifier of claim 7, further comprising a third transistor coupled between the second terminal of the frequency-selective network and the second current terminal of the first transistor, a control terminal of the third transistor being coupled to a bias voltage.

9. The amplifier of claim 8, wherein the frequency-selective network comprises a parallel arrangement of an inductor and a second capacitor.

10. The amplifier of claim 9, further comprising:
    a constant current source coupled between a second constant reference potential and a center-tap of the inductor; and
    a second capacitor coupled between the center-tap of the inductor and the first constant reference potential.

11. The amplifier of claim 8, wherein the frequency-selective network comprises:
    a series arrangement of a first RC circuit and a second RC circuit, each of the first RC circuit and the second RC circuit being formed by a parallel arrangement of a resistor and a capacitor.

12. The amplifier of claim 11, further comprising:
    a constant current source coupled between a second constant reference potential and a junction of the first RC circuit and the second RC circuit; and
    a second capacitor coupled between the junction and the first constant reference potential.

13. A device comprising:
    an antenna to receive an input signal via a wireless medium;
    a low-noise amplifier (LNA) to amplify the input signal and to generate an amplified signal;
    a down-converter to lower the carrier frequency of the amplified signal and to generate a down-converted signal;
    an analog to digital converter (ADC) to generate digital values representing the down-converted signal; and
    a baseband processor to process the digital values,
    wherein the LNA comprises:
    an input terminal to receive the input signal;
    a pair of output terminals to provide the amplified signal in differential form;
    a first transistor coupled between a first one of the pair of output terminals and a constant reference potential, wherein a control terminal of the first transistor is coupled to the input terminal, the first transistor to amplify the input signal;
    a second transistor coupled between a second one of the pair of output terminals and the input terminal, wherein a control terminal of the second transistor is coupled to the first one of the pair of output terminals; and
    a frequency-selective network coupled between the first one of the pair of output terminals and the second one of the pair of output terminals.

14. The device of claim 13, wherein the frequency-selective network determines a frequency selectivity of each of the input section and output section of the amplifier.

15. The device of claim 14, wherein the input terminal is designed to receive the input signal in single-ended form.

16. The device of claim 14, further comprising a third transistor coupled between the first one of the pair of output terminals and the first transistor, wherein the first transistor and the third transistor together form a cascode configuration.

17. The device of claim 16, wherein the frequency-selective network sets the frequency selectivity as a band-pass frequency response.

18. The device of claim 16, wherein the frequency-selective network sets the frequency selectivity as a low-pass frequency response.

* * * * *